United States Patent
Ma et al.

(10) Patent No.: US 11,002,888 B2
(45) Date of Patent: May 11, 2021

(54) DISPLAY PANEL AND DISPLAY DEVICE

(71) Applicant: BOE TECHNOLOGY GROUP CO., LTD., Beijing (CN)

(72) Inventors: Xinli Ma, Beijing (CN); Yafeng Yang, Beijing (CN); Jian Gao, Beijing (CN); Can Wang, Beijing (CN); Can Zhang, Beijing (CN); Jifeng Tan, Beijing (CN); Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 610 days.

(21) Appl. No.: 15/571,300

(22) PCT Filed: May 10, 2017

(86) PCT No.: PCT/CN2017/083716
§ 371 (c)(1),
(2) Date: Nov. 2, 2017

(87) PCT Pub. No.: WO2017/202201
PCT Pub. Date: Nov. 30, 2017

(65) Prior Publication Data
US 2018/0231694 A1 Aug. 16, 2018

(30) Foreign Application Priority Data
May 27, 2016 (CN) .......................... 201610366335.4

(51) Int. Cl.
*G02B 3/00* (2006.01)
*H01L 51/52* (2006.01)
(Continued)

(52) U.S. Cl.
CPC ........... *G02B 3/005* (2013.01); *G02B 3/0043* (2013.01); *G02B 5/201* (2013.01); *G02B 30/52* (2020.01);
(Continued)

(58) Field of Classification Search
CPC ...... G02B 3/005; G02B 3/0043; G02B 30/52; G02B 5/201; H01L 51/0096;
(Continued)

(56) References Cited

U.S. PATENT DOCUMENTS

| 6,215,593 B1 * | 4/2001 | Bruce ...................... G02B 6/08 359/619 |
| 2005/0057807 A1 | 3/2005 | Takagi et al. |

(Continued)

FOREIGN PATENT DOCUMENTS

| CN | 101114055 A | 1/2008 |
| CN | 102081237 A | 6/2011 |

(Continued)

OTHER PUBLICATIONS

Third Office Action for Chinese Patent Application No. 201610366335.4 dated Jun. 4, 2018.

(Continued)

*Primary Examiner* — Travis S Fissel
(74) *Attorney, Agent, or Firm* — Calfee, Halter & Griswold LLP (57) ABSTRACT

A display panel and a display device are disclosed. The display panel includes a flat display substrate and optical devices. The optical devices are arranged on a display surface of the flat display substrate, and light emitted through the display surface of the flat display substrate passes through the optical devices and forms an image in a curved surface.

15 Claims, 4 Drawing Sheets (51) Int. Cl.
  *G02F 1/1335* (2006.01)
  *G02B 5/20* (2006.01)
  *G02B 30/52* (2020.01)
  *H01L 51/00* (2006.01)
  *H01L 27/32* (2006.01)
  *G02F 1/29* (2006.01)

(52) U.S. Cl.
  CPC ...... *H01L 51/0096* (2013.01); *H01L 51/5275* (2013.01); *G02F 1/133526* (2013.01); *G02F 1/29* (2013.01); *G02F 1/291* (2021.01); *G02F 2201/52* (2013.01); *G02F 2203/62* (2013.01); *H01L 27/3211* (2013.01)

(58) Field of Classification Search
  CPC ............. H01L 51/5275; H01L 27/3211; G02F 1/133526; G02F 1/29; G02F 2001/291; G02F 2203/62
  USPC ....... 359/443, 454, 462, 463, 455, 619, 620, 359/621; 349/57, 95, 13, 15
  See application file for complete search history.

(56) References Cited

U.S. PATENT DOCUMENTS

| | | | | |
|---|---|---|---|---|
| 2011/0255159 | A1* | 10/2011 | Krijn | ...................... G02B 30/27 359/463 |
| 2015/0124061 | A1* | 5/2015 | Jian | ...................... H04N 13/122 348/51 |
| 2015/0160464 | A1* | 6/2015 | Oh | ........................... G02F 1/29 349/15 |
| 2015/0331154 | A1* | 11/2015 | Matsushima | .......... G02B 3/005 428/172 |
| 2016/0195646 | A1 | 7/2016 | Su et al. | |
| 2018/0164472 | A1 | 6/2018 | Gao et al. | |

FOREIGN PATENT DOCUMENTS

| | | | |
|---|---|---|---|
| CN | 102662208 | A | 9/2012 |
| CN | 104464523 | A | 3/2015 |
| CN | 105572930 | A | 5/2016 |
| CN | 105589277 | A | 5/2016 |
| CN | 105607380 | A | 5/2016 |
| CN | 105842905 | A | 8/2016 |
| CN | 105866865 | A | 8/2016 |
| CN | 205809336 | U | 12/2016 |
| KR | 20130064333 | A | 6/2013 |

OTHER PUBLICATIONS

Search Report for international Patent Application No. PCT/CN2017/083716 dated Aug. 3, 2017.

First Office Action for Chinese Patent Application No. 201610366335.4 dated Apr. 19, 2017.

Second Office Action for Chinese Patent Application No. 201610366335.4 dated Nov. 17, 2017.

Third Office Action for Chinese Patent Application No. 201510366335.4 dated Jun. 4, 2018.

* cited by examiner

DISPLAY PANEL AND DISPLAY DEVICE

RELATED APPLICATIONS

The present application is the U.S. national phase entry of PCT/CN2017/083716, with an international filing date of May 10, 2017, which claims the benefit of Chinese Patent Application No. 201610366335.4, filed on May 27, 2016, the entire disclosures of which are incorporated herein by reference.

TECHNICAL FIELD

The present disclosure relates to the field of display technology, and particularly to a display panel and display device.

BACKGROUND

A user's visual perception can be satisfied well with a curved display panel. The curved display provides more comfortable visual experience and realistic scene feeling for the user, and thus provides an enhanced immersive effect.

Generally a flat display substrate is physically and mechanically bent to form a curved display panel for realizing a curved display. However, in this method for realizing a curved display, a deformation of a fringe field results in defects like light leakage and abnormal color display in the display panel.

Moreover, in order to realize the curved display, many modules in the display panel have to adopt flexible design, and this leads to a low yield and high cost of the product.

SUMMARY

Embodiments of the present disclosure provide a display panel and a display device, for realizing the curved display effect with a flat display substrate.

In an embodiment of the present disclosure, a display panel comprises a flat display substrate and optical devices, wherein the optical devices are arranged on a display surface of the flat display substrate, and light emitted through the display surface of the flat display substrate passes through the optical devices and forms an image in a curved surface.

In the display panel according to an embodiment of the present disclosure, the display panel is provided with optical devices arranged in an array on the display surface of the flat display substrate, and the optical devices enable an image formed by the flat display substrate to lie in a spatially curved surface. Therefore, the curved display effect can be realized on the flat display substrate.

In certain exemplary embodiments, the optical devices are lenticular lenses. In an example, the lenticular lenses at a position corresponding with a middle region of the flat display substrate have a focus length which is different from the focus length of the lenticular lenses at a position corresponding with at least one peripheral regions of the flat display substrate.

In certain exemplary embodiments, the optical devices are liquid crystal lenses. In an example, a deflection degree of liquid crystal in the liquid crystal lenses at a position corresponding with the middle region of the flat display substrate is different from the deflection degree of liquid crystal in the liquid crystal lenses at a position corresponding with at least one peripheral regions of the flat display substrate.

In certain exemplary embodiments, the optical devices are a combination of lenticular lenses and liquid crystal lenses. In an example, a portion of the optical devices are lenticular lenses, and the remaining optical devices are liquid crystal lenses.

In certain exemplary embodiments, the optical devices at a position corresponding with the middle region of the flat display panel have an optical parameter which is different from the optical parameter of the optical devices at a position corresponding with a peripheral region of the flat display panel. The optical parameter is a focus length of the lenticular lenses or a deflection degree of liquid crystal in the liquid crystal lenses.

In certain exemplary embodiments, two of the optical devices which are arranged symmetrically with respect to a central symmetrical axis of the flat display substrate have a same optical parameter. In certain exemplary embodiments, two of the lenticular lenses which are arranged symmetrically with respect to the central symmetrical axis of the flat display substrate have a same focus length.

In certain exemplary embodiments, an object distance between each lenticular lens and the flat display substrate is smaller than the focus length of each lenticular lens, and a focus length of each lenticular lens decreases with an increase in a distance between the lenticular lens and the central symmetrical axis.

In certain exemplary embodiments, an object distance between each lenticular lens and the flat display substrate is larger than a focus length of each lenticular lens, and a focus length of each lenticular lens increases with an increase in a distance between the lenticular lens and the central symmetrical axis.

In certain exemplary embodiments, an object distance between each lenticular lens at a position corresponding with the middle region of the flat display substrate and the flat display substrate is smaller than the focus length of the lenticular lens at this position, and an object distance between each lenticular lens at a position corresponding with the display panel peripheral region and the flat display substrate is larger than the focus length of the lenticular lens at this position.

In certain exemplary embodiments, the position of each of the lenticular lenses corresponds with the position of each pixel or each sub-pixel in the flat display substrate in a one-to-one manner.

In certain exemplary embodiments, each of the lenticular lenses is arranged vertically.

In certain exemplary embodiments, the position of each of the lenticular lenses corresponds with the position of a column of pixels or a column of sub-pixels in the flat display substrate in a one-to-one manner.

In certain exemplary embodiments, a width of each of the lenticular lenses in a horizontal direction equals to a width of the pixel at a position corresponding with the lenticular lens in a horizontal direction.

In certain exemplary embodiments, a width of each of the lenticular lenses in a horizontal direction equals to a width of the sub-pixel at a position corresponding with the lenticular lens in a horizontal direction.

In certain exemplary embodiments, two of the liquid crystal lenses which are arranged symmetrically with respect to the central symmetrical axis of the flat display substrate have a same deflection degree of liquid crystal.

In certain exemplary embodiments, the position of each of the liquid crystal lenses corresponds with the position of each pixel or each sub-pixel in the flat display substrate in a one-to-one manner.

In certain exemplary embodiments, the flat display substrate is a liquid crystal display panel or an organic light emitting display panel.

Embodiments of the present disclosure further provide a display device comprising the display panel as described above.

DETAILED DESCRIPTION OF EMBODIMENTS

Embodiments of the present disclosure provide a display panel and a display device, for realizing the curved display effect with a flat display substrate.

In order to explain the technical solutions in the embodiments of the present disclosure or the prior art more clearly, the drawings to be used in the description of the embodiments or the prior art will be introduced briefly in the following, apparently, the drawings described below are only some embodiments of the present disclosure, the ordinary skilled person in the art, on the premise of not paying any creative work, can also obtain other drawings from these drawings.

The display panel according to embodiments of the present disclosure will be described in detail hereinafter with reference to the accompanying drawings.

The shape and size of components in the drawings do not reflect the true scale of the display panel, but schematically show the contents of the present disclosure.

Figure 1:
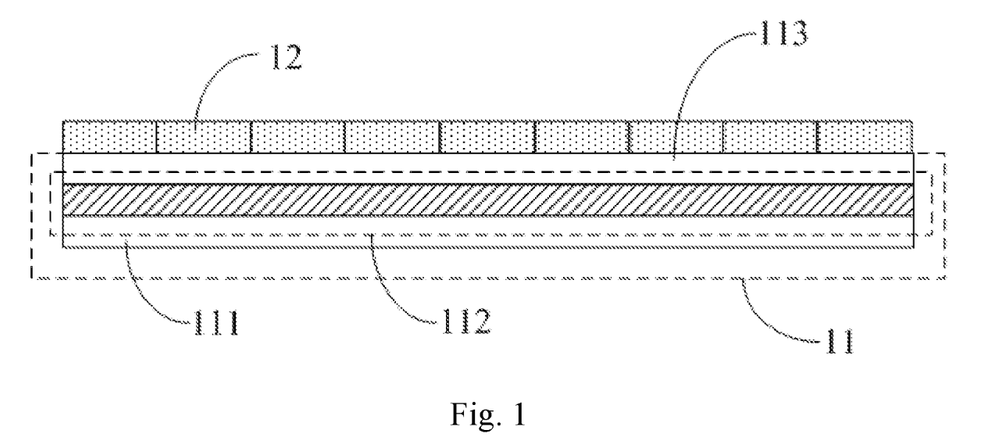
FIG. 1 is a structural view for illustrating a display panel in an embodiment of the present disclosure.

As shown in FIG. 1, an embodiment of the present disclosure provides a display panel, comprising a flat display substrate 11, and optical devices 12 which are arranged in an array on a display surface of the flat display substrate 11. The optical devices 12 enable an image formed by the flat display substrate 11 to lie in a spatially curved surface.

In an embodiment, the flat display substrate 11 is a liquid crystal display panel or an organic light emitting display panel. Of course, during practical production, the flat display substrate 11 for example is a flat display substrate for a plasma display panel, and embodiments of the present disclosure are not limited in term of the type of the flat display substrate.

As shown in FIG. 1, in embodiments of the present disclosure, the flat display substrate 11 will be described in detail by taking an organic light emitting display panel as an example. In an embodiment, the flat display substrate 11 comprises a backplate 111, an organic light emitting display device 112 which is arranged on the backplate 111, and a glass cover plate 113 which is arranged on the organic light emitting display device 112. The arrangement in the organic light emitting display panel is identical with that of the conventional one, which is not repeated here for simplicity. The display surface of the flat display substrate 11 is a light exit surface of the flat display substrate 11.

In the display panel according to embodiments of the present disclosure, the display panel is provided with optical devices which are arranged in an array on the display surface of the flat display substrate, and the optical devices enable the image formed by the flat display substrate to lie in a spatially curved surface. This realizes the curved display effect on the flat display substrate.

Optical devices according to embodiments of the present disclosure will be described in detail hereinafter with reference to the accompanying drawings.

Figure 2:
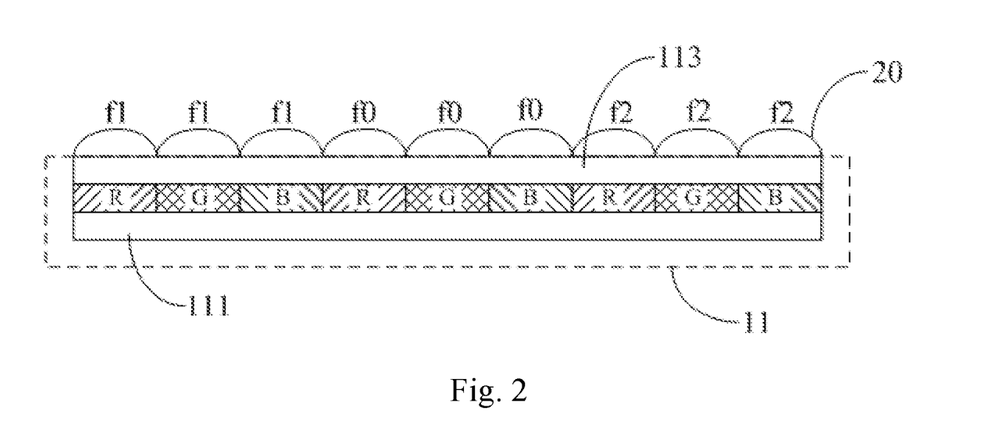
FIG. 2 is a structural view for illustrating a display panel in an embodiment of the present disclosure in which the optical devices are lenticular lenses.

As shown in FIG. 2, in an embodiment, the optical devices are lenticular lenses 20. An optical parameter of the lenticular lenses 20 at a position corresponding with different regions of the flat display substrate 11 is set accordingly. For example, in this embodiment, the optical parameter is the focus length of lenticular lenses 20.

For example, the lenticular lenses 20 at a position corresponding with the middle region of the flat display substrate 11 have a focus length which is different from the focus length of the lenticular lenses 20 at a position corresponding with at least one peripheral regions of the flat display substrate 11. For example, in this figure, the lenticular lenses 20 at a position corresponding with the middle region of the flat display substrate 11 have a focus length f0, the lenticular lenses 20 at a position corresponding with the left edge of the flat display substrate 11 have a focus length f1, the lenticular lenses 20 at a position corresponding with the right edge of the flat display substrate 11 have a focus length f2, and f0≠f1≠f2. According to the image forming principle of lenticular lenses, the focus length of lenticular lenses 20 at different positions f0≠f1≠f2. Thus, in this embodiment, the lenticular lenses enable the image formed by the flat display substrate to lie in a spatially curved surface.

In an embodiment, for example, two lenticular lenses 20 which are arranged symmetrically with respect to the central symmetrical axis of the flat display substrate 11 have a same focus length. As shown in FIG. 2, in this case, the focus length of lenticular lenses 20 f1=f2. In an embodiment, the central symmetrical axis of the flat display substrate for example is a vertical central symmetrical axis. The vertical central symmetrical axis of the flat display substrate 11 indicates a symmetrical axis in the vertical direction of the flat display substrate 11 with respect to human eyes. In a practical design, since two lenticular lenses 20 which are arranged symmetrically with respect to the vertical central symmetrical axis of the flat display substrate have a same focus length, the lenticular lenses enable the image formed by the flat display substrate 11 to lie in a spatially curved surface which is symmetrical with respect to the vertical central symmetrical axis.

In an embodiment, the position of each of the lenticular lenses corresponds with the position of each of the pixels in the flat display substrate in a one-to-one manner, and each of the lenticular lenses is arranged vertically. In an embodiment, the position of each of the lenticular lenses corresponds with the position of each of the sub-pixels which form pixels in the flat display substrate in a one-to-one manner, and each of the lenticular lenses is arranged vertically. In this way, the lenticular lenses enable the image formed by the flat display substrate to lie in a spatially curved surface which facilitates viewing by the user.

In an embodiment, the position of each of the lenticular lenses corresponds with the position of a column of pixels in the flat display substrate in a one-to-one manner. In an embodiment, the position of each of the lenticular lenses corresponds with the position of a column of sub-pixels which form pixels in the flat display substrate in a one-to-one manner. In this way, the lenticular lenses of this embodiment enable the image formed by the flat display substrate to lie in a spatially curved surface which facilitates viewing by the user. Moreover, the number of lenticular lenses and the requirement for design accuracy can be reduced during production. This reduces production time and saves cost.

Figure 3:
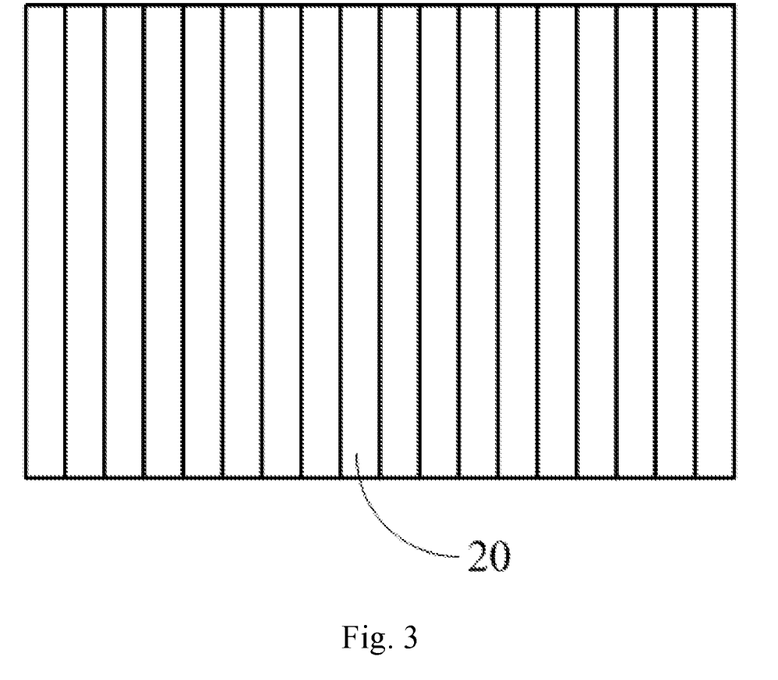
FIG. 3 is a structural view for illustrating lenticular lenses in an embodiment of the present disclosure.

In an embodiment, the lenticular lenses 20 are arranged as shown in FIG. 3, in which each of the lenticular lenses 20 is arranged vertically. For example, a width of the lenticular lenses 20 in a horizontal direction equals to a width of the pixels at a position corresponding with the lenticular lenses 20 in a horizontal direction. For example, a width of the lenticular lenses 20 in a horizontal direction equals to a width of sub-pixels which form pixels at a position corresponding with the lenticular lenses in a horizontal direction. In this way, each of the lenticular lenses can receive light emitted from the pixel or sub-pixel of the respective flat display substrate to the maximum extent, and this reduces the effect of stray light of imaging.

Figure 4A:
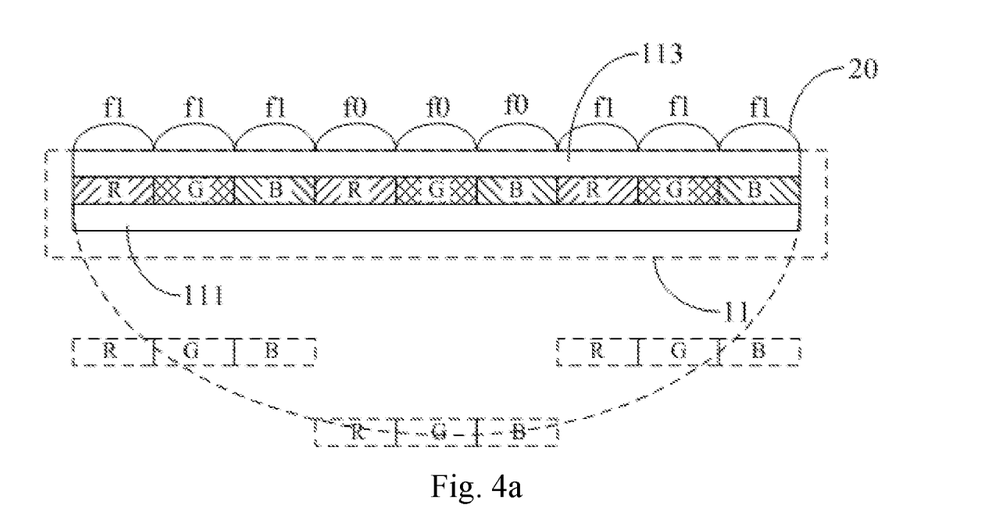
FIG. 4a, FIG. 4b, and FIG. 4c are schematic views for illustrating a display panel in an embodiment of the present disclosure in which a curved display is being realized.
Figure 4B:
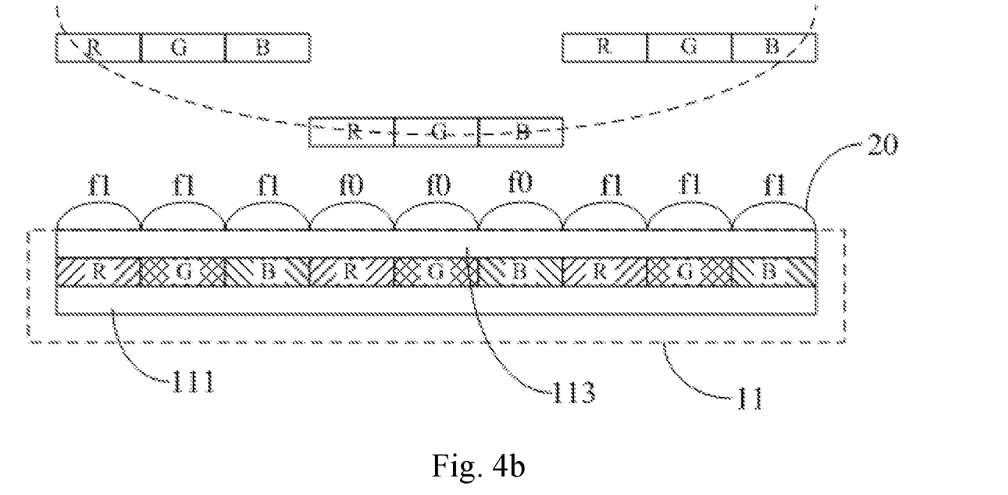
Figure 4C:
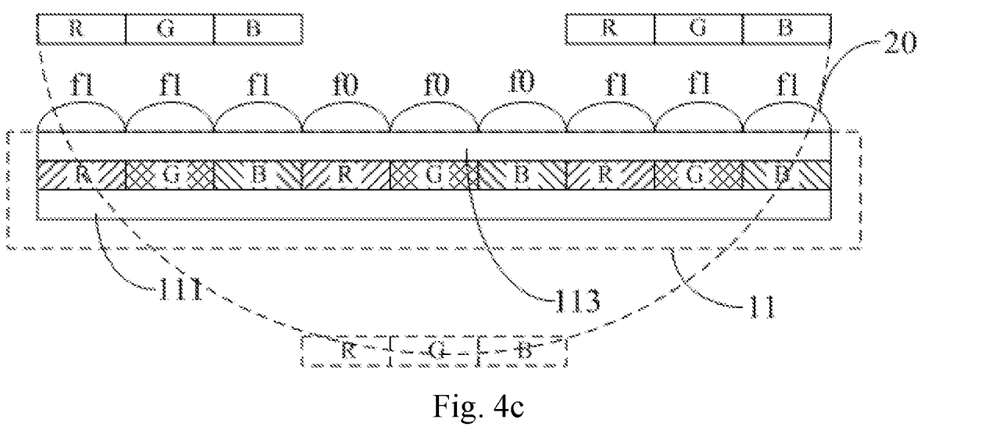

A process for realizing the curved display by means of a plurality of lenticular lenses in an embodiment of the present disclosure will be described hereinafter with reference to FIG. 4a, FIG. 4b, and FIG. 4c. FIG. 4a, FIG. 4b, and FIG. 4c show sub-pixels R, G, and B which form pixels in the flat display substrate. In this embodiment, reference is made to a case in which the position of each of the lenticular lenses corresponds with the position of each of the sub-pixels which form pixels in the flat display substrate in a one-to-one manner.

In an embodiment of the present disclosure, according to the image forming principle of the lenticular lenses, the focus length of the lenticular lenses is set in such a manner that a distance between the pixels of the flat display substrate and the lenticular lenses, i.e., an object distance, is smaller than the focus length of each of the lenticular lenses. As a result, images formed by pixels at different positions of the flat display substrate constitute an upright enlarged virtual image which is perceived by human eyes, as shown in FIG. 4a. In an embodiment, for example, the focus length of the lenticular lenses is set in such a manner that a distance between the pixels of the flat display substrate and the lenticular lenses, i.e., object distance, is larger than the focus length of each of the lenticular lenses. As a result, images formed by pixels at different positions of the flat display substrate constitute an inverted real image which is perceived by human eyes, as shown in FIG. 4b. In an embodiment, the focus length of the lenticular lenses is set in such a manner that the distance between a portion of the pixels of the flat display substrate and the lenticular lenses is larger than the focus length of the lenticular lenses at a position corresponding with this portion of pixels, and the distance between another portion of the pixels of the flat display substrate and the lenticular lenses is smaller than the focus length of the lenticular lenses at a position corresponding with the another portion of pixels of the flat display substrate. As a result, images formed by the portion of pixels of the flat display substrate constitute an upright virtual image, and images formed by the another portion of pixels of the flat display substrate constitute an inverted real image, as shown in FIG. 4c.

According to the image forming principle of the lenticular lenses, when the object distance is constant, lenticular lenses with different focus lengths f can correspond to different image distances. Therefore, as shown in FIG. 4a, the object distance between each of the lenticular lenses 20 and the flat display substrate 11 is set smaller than the focus length of each of the lenticular lenses 20, and the focus length of each of the lenticular lenses 20 decreases with an increase in the distance between the lenticular lenses 20 and the central symmetrical axis. Namely, in FIG. 4a, the lenticular lens 20 with a focus length of f0 is taken as the central symmetrical axis, and f0>f1. Finally, the image formed by the flat display substrate lies in a spatially curved surface, thus realizing the curved display effect.

Of course, in a practical design, it is also possible that the object distance between each of the lenticular lenses 20 and the flat display substrate 11 is set smaller than the focus length of each of the lenticular lenses 20, and the focus length of each of the lenticular lenses 20 increases with an increase in the distance between the lenticular lenses 20 and the central symmetrical axis. However, in this case, the spatially curved surface in which the image formed by the flat display substrate protrudes in the middle part and depresses at both sides for human eyes, and this is not favorable for viewing by the user.

Furthermore, according to the image forming principle of lenticular lenses, different radii of curvature r of the lenticular lenses can correspond with different focus lengths f. In order that the lenticular lenses have different focus lengths f the radius of curvature r of each lenticular lens is set, if the lenticular lenses are made from a same material.

According to the image forming principle of lenticular lenses, a magnification factor of the formed image equals to the image distance divided by the object distance. As shown in FIG. 4a, images formed by pixels at different positions pass the lenticular lenses, and the formed images have different image distances. Thus, the lenticular lenses show different magnification factors for images formed by pixels at different positions in the flat display substrate. Referring to FIG. 4a, the lenticular lenses show a small magnification factor for the images formed by pixels at a position corresponding with two sides of the flat display substrate, and show a large magnification factor for the images formed by pixels at a position corresponding with the middle region of the flat display substrate. Thus, during practical production, the signal applied to the flat display substrate can be adjusted accordingly. For example, the signal applied to pixels at a position corresponding with the middle region of the flat display substrate is smaller than the signal applied to pixels at a position corresponding with the two sides of the flat display substrate.

According to the image forming principle of lenticular lenses, when the object distance is constant, lenticular lenses with different focus lengths f can correspond to different image distances. Thus, as shown in FIG. 4b, the object distance between each of the lenticular lenses 20 and the flat display substrate 11 is set larger than the focus length of each of the lenticular lenses 20, and the focus length of each of the lenticular lenses 20 increases with an increase in the distance between the lenticular lenses 20 and the central symmetrical axis. Namely, in FIG. 4b, the lenticular lens 20 with the focus length of f0 is taken as the central symmetrical axis, and f0<f1. Finally, the image formed by the flat display substrate lies in a spatially curved surface, thus realizing the curved display effect. Images formed by pixels at different positions of the flat display substrate pass through each of the lenticular lenses 20 and constitute an inverted enlarged real image, an inverted equal real image, or an inverted reduced real image.

In embodiments of the present disclosure, when the object distance between each of the lenticular lenses and the flat display substrate is larger than the focus length of each of the lenticular lenses, images formed by pixels at different positions of the flat display substrate pass through the lenticular lenses and form an image which is an inverted real image. Thus, during practical production, the signal applied to the flat display substrate can also be adjusted accordingly. For example, the signal applied to the flat display substrate renders the flat display substrate to display an inverted image.

According to the image forming principle of lenticular lenses, when the object distance is constant, lenticular lenses with different focus lengths f can correspond to different image distances. Thus, as shown in FIG. 4c, the object distance between each of the lenticular lenses 20 at a position corresponding with the middle region of the flat display substrate 11 and the flat display substrate is smaller than the focus length of the lenticular lenses 20 at this position, and the object distance between each of the lenticular lenses 20 at a position corresponding with the peripheral region of the flat display substrate 11 and the flat display substrate 11 is larger than the focus length of the lenticular lenses 20 at this position. In this case, images formed by pixels at the position corresponding with the middle region of the flat display substrate 11 pass through the lenticular lenses and form a virtual image, and images formed by pixels at the position corresponding with the peripheral region of the flat display substrate 11 pass through the lenticular lenses and form a real image.

Based on a same design, in FIG. 4c, as for the lenticular lenses at the position corresponding with the middle region of the flat display substrate, the focus length decreases with an increase in the distance between the lenticular lenses and the central symmetrical axis, while as for the lenticular lenses at the position corresponding with peripheral region of the flat display substrate, the focus length increases with an increase in the distance between the lenticular lenses and the central symmetrical axis.

Figure 5:
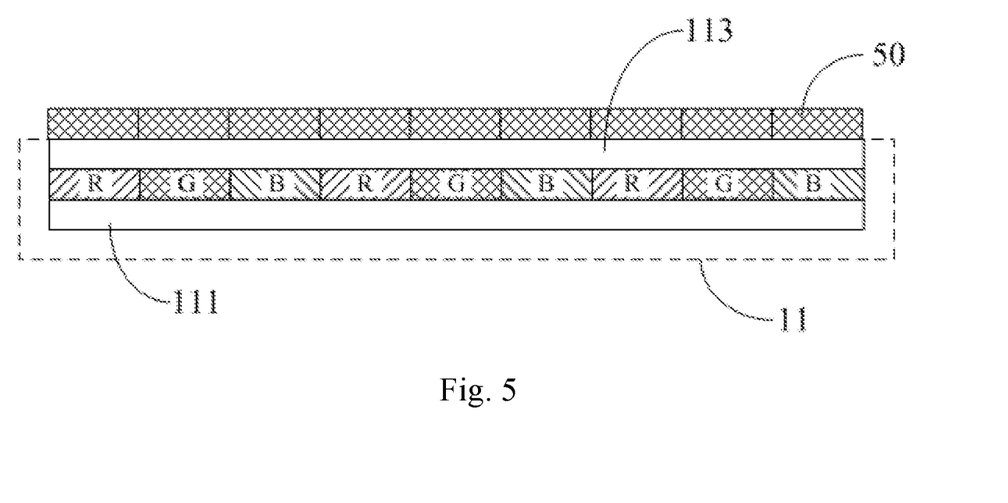
FIG. 5 is a structural view for illustrating a display panel in an embodiment of the present disclosure in which the optical devices are liquid crystal lenses.

As shown in FIG. 5, in an embodiment, the optical devices are liquid crystal lenses 50, and liquid crystal lens 50 at a position corresponding with different regions of the flat display substrate 11 are set accordingly. In this case, the optical parameter is a deflection degree of liquid crystal in liquid crystal lenses 50. The deflection degree of liquid crystal in liquid crystal lenses 50. The deflection degree of liquid crystal in liquid crystal lenses 50 at a position corresponding with the middle region of the flat display substrate 11 is different from the deflection degree of liquid crystal of liquid crystal lenses 50 at a position corresponding with at least one peripheral regions of the flat display substrate 11.

The liquid crystal lens is a novel micro-lens which modifies the spatial distribution of refractive index by electro-optical effect and is fabricated by a microelectronic process. It is a novel optical device which combines the properties of the micro-lens and the excellent electrical control performance of the liquid crystal. The liquid crystal lens has advantages of micro size, adjustable focus length, or the like.

Figure 6:
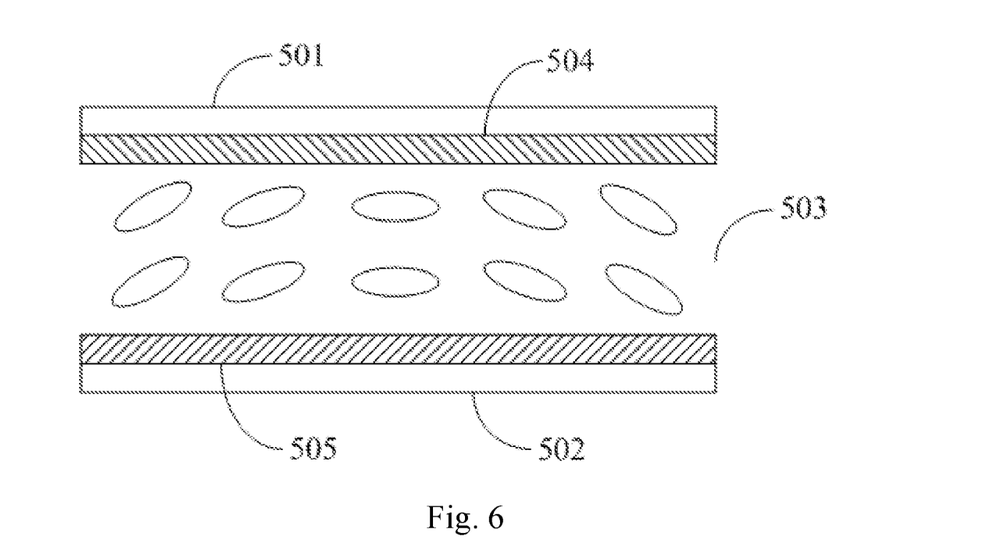
FIG. 6 is a structural view for illustrating liquid crystal lenses in an embodiment of the present disclosure.

As shown in FIG. 6, in an embodiment, each of the liquid crystal lenses 50 comprises an upper base plate 501 and a lower base plate 502 which are arranged oppositely, a liquid crystal 503 which is arranged between the upper base plate 501 and the lower base plate 502, a first electrode 504 which is arranged at a side of the upper base plate 501 facing the lower base plate 502, and a second electrode 505 which is arranged at a side of the lower base plate 502 facing the upper base plate 501.

For example, two liquid crystal lenses which are arranged symmetrically with respect to the central symmetrical axis of the flat display substrate have a same deflection degree of liquid crystal. This forms a symmetrically curved display, and further improves viewing experience for the user. For example, deflection of liquid crystal is controlled by the voltage across the first and second electrodes in the liquid crystal lens.

In an embodiment, the position of each liquid crystal lens corresponds with the position of each of the pixels in the flat display substrate in a one-to-one manner. In an embodiment, the position of each liquid crystal lens corresponds with the position of each of the sub-pixels which form pixels in the flat display substrate in a one-to-one manner. The position of liquid crystal lenses can be set in a similar manner with the position of lenticular lenses in FIGS. 2, 3, 4a-4c, which is not repeated here for simplicity.

In embodiments of the present disclosure, the image forming principle of the liquid crystal lenses is identical with the existing ones, which is not repeated here for simplicity. Moreover, the liquid crystal lenses can also adopt other known types of liquid crystal lenses, and embodiments of the present disclosure are not limited by the type of the liquid crystal lens.

Figure 7:
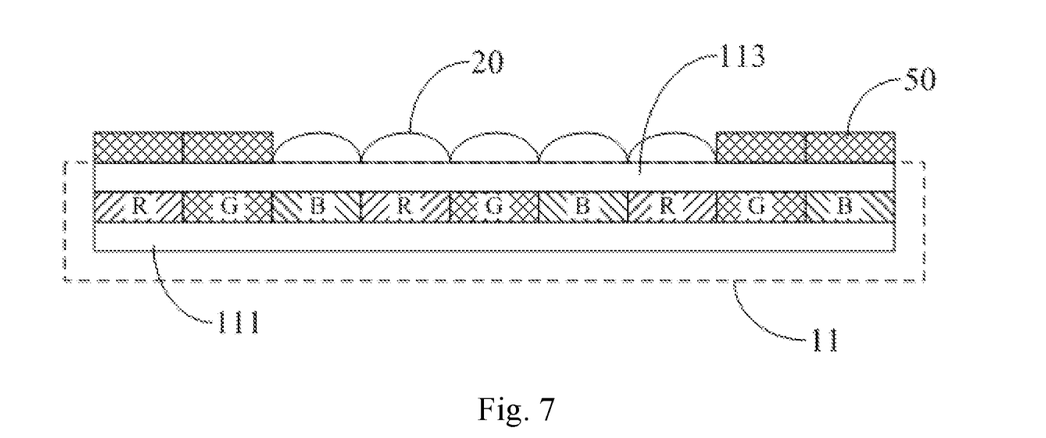
FIG. 7 is a structural view for illustrating a display panel in an embodiment of the present disclosure in which some optical devices are lenticular lenses, and the remaining optical devices are liquid crystal lenses.

In an embodiment, some optical devices are lenticular lenses, and the remaining optical devices are liquid crystal lenses. As shown in FIG. 7, in an embodiment of the present disclosure, the image forming principle of lenticular lenses is similar with the image forming principle of lenticular lenses as described in embodiments shown in FIGS. 2, 3, 4a-4c, and the image forming principle of liquid crystal lenses is similar with the image forming principle of liquid crystal lenses as described in embodiments shown in FIGS. 5-6, which are not repeated here for simplicity.

In embodiments of the present disclosure, the focus length of the lenticular lenses, and the voltage across the first and second electrodes in the liquid crystal lenses are set appropriately, so that the image formed by the flat display substrate lies in a spatially curved surface. These parameters can be set according to practical production, in view of the image forming principle in embodiments shown in FIGS. 2-6, which is not repeated here for simplicity.

Embodiments of the present disclosure further provide a display device comprising the display panel as described in the above embodiments. The display device is a display device like a mobile phone, tablet computer, notebook computer, liquid crystal panel, liquid crystal display device, liquid crystal TV, organic light emitting diode (OLED) panel, OLED display device, OLED TV, or electronic paper.

To sum up, embodiments of the present disclosure provide a display panel comprising a flat display substrate and optical devices. The optical devices are arranged on a display surface of the flat display substrate, and light emitted through the display surface of the flat display substrate passes through the optical devices and forms an image in a curved surface. The display panel is provided with optical devices on the display surface of the flat display substrate, all optical device enable an image formed by the flat display substrate to lie in a spatially curved surface. Therefore, the curved display effect can be realized on the flat display substrate.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A display panel comprising:
a flat display substrate;
lenticular lenses arranged on a display surface of the flat display substrate so that light emitted through the display surface passes through the lenticular lenses and forms an image on a curved surface;
wherein one of the lenticular lenses arranged at a position corresponding with a middle region of the flat display panel has a focus length that is different from a focus length of one of the lenticular lenses arranged at a position corresponding with a peripheral region of the flat display panel;
wherein one of the lenticular lenses arranged at a position corresponding with a middle region of the flat display panel has a shortest distance to the curved surface which is different from a shortest distance to the curved surface of one of the lenticular lenses arranged at a position corresponding with a peripheral region of the flat display panel; and
wherein an object distance between each lenticular lens and the flat display substrate is smaller than the focus length of each lenticular lens, and the focus length of each lenticular lens decreases with an increase in a distance between the lenticular lens and a central symmetrical axis of the flat display substrate.

2. A display panel comprising:
a flat display substrate;
lenticular lenses arranged on a display surface of the flat display substrate so that light emitted through the display surface passes through the lenticular lenses and forms an image on a curved surface;
wherein one of the lenticular lenses arranged at a position corresponding with a middle region of the flat display panel has a focus length that is different from a focus length of one of the lenticular lenses arranged at a position corresponding with a peripheral region of the flat display panel;
wherein one of the lenticular lenses arranged at a position corresponding with a middle region of the flat display panel has a shortest distance to the curved surface which is different from a shortest distance to the curved surface of one of the lenticular lenses arranged at a position corresponding with a peripheral region of the flat display panel; and
wherein an object distance between each lenticular lens and the flat display substrate is larger than a focus length of each lenticular lens, and the focus length of each lenticular lens increases with an increase in a distance between the lenticular lens and a central symmetrical axis of the flat display substrate.

3. A display panel comprising:
a flat display substrate;
lenticular lenses arranged on a display surface of the flat display substrate so that light emitted through the display surface passes through the lenticular lenses and forms an image on a curved surface;
wherein one of the lenticular lenses arranged at a position corresponding with a middle region of the flat display panel has a focus length that is different from a focus length of one of the lenticular lenses arranged at a position corresponding with a peripheral region of the flat display panel;
wherein one of the lenticular lenses arranged at a position corresponding with a middle region of the flat display panel has a shortest distance to the curved surface which is different from a shortest distance to the curved surface of one of the lenticular lenses arranged at a position corresponding with a peripheral region of the flat display panel; and
wherein an object distance between each lenticular lens at a position corresponding with the middle region of the flat display substrate and the flat display substrate is smaller than the focus length of the lenticular lens at this position, and an object distance between each lenticular lens at a position corresponding with the peripheral region of the flat display panel and the flat display substrate is larger than the focus length of the lenticular lens at this position.

4. The display panel of claim 1, wherein an extending direction of an orthographic projection of each of the lenticular lenses on the flat display substrate is parallel to an extending direction of an orthographic projection of one of a column of pixels and a column of sub-pixels in the flat display substrate on the flat display substrate.

5. The display panel of claim 1, wherein the position of each of the lenticular lenses corresponds with the position of a column of pixels or a column of sub-pixels in the flat display substrate in a one-to-one manner.

6. The display panel of claim 1, wherein a width of each of the lenticular lenses in a horizontal direction equals to a width of the pixel or sub-pixel in a horizontal direction at a position corresponding with the lenticular lens.

7. The display panel of claim 1, wherein the flat display substrate is a liquid crystal display panel or an organic light emitting display panel.

8. The display panel of claim 1, wherein the lenticular lenses comprise liquid crystal lenses.

9. The display panel of claim 2, wherein the lenticular lenses comprise liquid crystal lenses.

10. The display panel of claim 3, wherein the lenticular lenses comprise liquid crystal lenses.

11. The display panel of claim 2, wherein a width of each of the lenticular lenses in a horizontal direction equals to a width of the pixel or sub-pixel in a horizontal direction at a position corresponding with the lenticular lens.

12. The display panel of claim 3, wherein a width of each of the lenticular lenses in a horizontal direction equals to a width of the pixel or sub-pixel in a horizontal direction at a position corresponding with the lenticular lens.

13. The display panel of claim 1, wherein two of the lenticular lenses which are arranged symmetrically with respect to the central symmetrical axis of the flat display substrate have a same focus length and have a same shortest distance to the curved surface.

14. The display panel of claim 2, wherein two of the lenticular lenses which are arranged symmetrically with respect to the central symmetrical axis of the flat display substrate have a same focus length and have a same shortest distance to the curved surface.

15. The display panel of claim 3, wherein two of the lenticular lenses which are arranged symmetrically with respect to the central symmetrical axis of the flat display substrate have a same focus length and have a same shortest distance to the curved surface.

* * * * *